United States Patent [19]

Dunkley

[11] Patent Number: 5,189,595
[45] Date of Patent: Feb. 23, 1993

[54] EDGE SHRINKAGE COMPENSATED DEVICES

[75] Inventor: James Dunkley, Mission Viejo, Calif.

[73] Assignee: Silicon Systems, Inc., Tustin, Calif.

[21] Appl. No.: 837,727

[22] Filed: Feb. 19, 1992

[51] Int. Cl.[5] .......................... H01G 4/06; H01L 27/02
[52] U.S. Cl. .................................... 361/313; 257/532; 257/537; 257/919; 338/333
[58] Field of Search ...................... 361/311-313; 357/51; 437/47, 52, 65; 29/25.42

[56] References Cited

U.S. PATENT DOCUMENTS

| | | | |
|---|---|---|---|
| 3,273,033 | 9/1966 | Rossmeisl | 361/313 |
| 4,990,462 | 2/1991 | Sliwa | 437/51 |
| 5,079,670 | 1/1992 | Tigelaar et al. | 361/313 |
| 5,087,951 | 2/1992 | Chance et al. | 357/51 X |

Primary Examiner—Donald A. Griffin
Attorney, Agent, or Firm—Hecker & Harriman

[57] ABSTRACT

Improved, edge compensated capacitors and a method for making the same are presented. The present invention arranges individual cells of capacitors and uses passive dummy cells so as to achieve a ratio between the length of the exposed perimeters of the cells of the two capacitors that is equal to the desired capacitance ratio between the two capacitors. By doing so, the edge shrinkage effects on both cells are taken into account, and accurate capacitor ratios are maintained. In one embodiment of the invention the number of intersections between exposed edges of the cells of the two capacitors are also adjusted to conform to the capacitor ratio to achieve additional edge shrinkage compensation.

37 Claims, 9 Drawing Sheets

700

-510a-

710

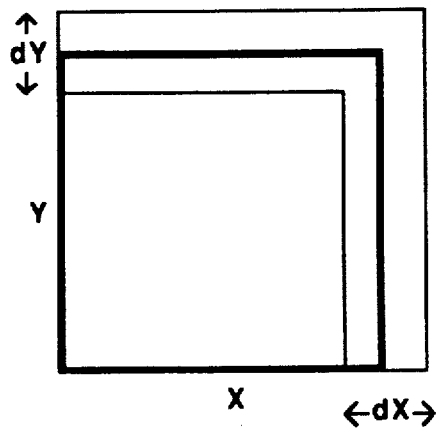
Figure 1
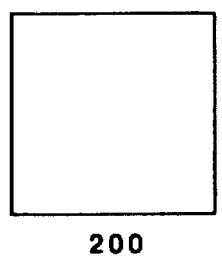
Figure 2A
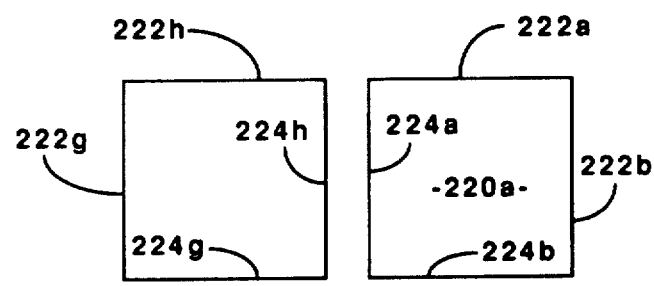
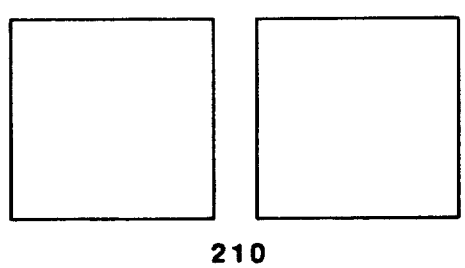
Figure 2B
Figure 2C

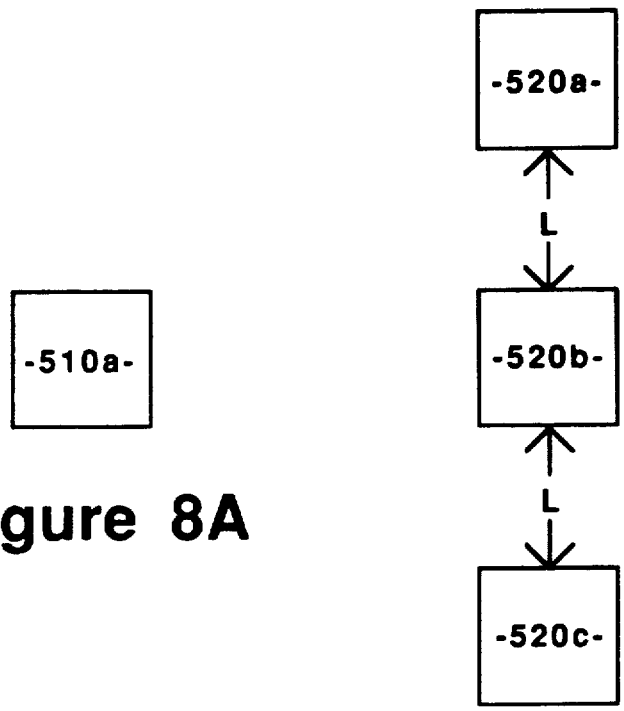
Figure 8A
Figure 8B
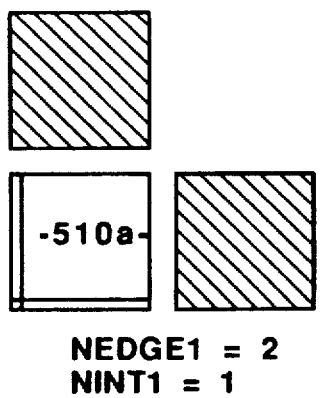
NEDGE1 = 2
NINT1 = 1
Figure 9A
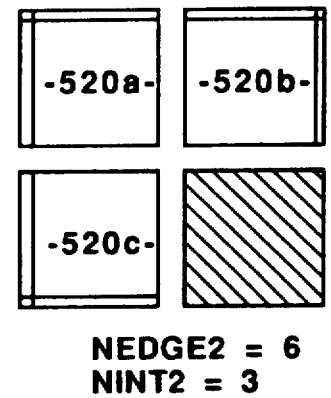
NEDGE2 = 6
NINT2 = 3
Figure 9B

NEDGE1=3
NINT1=2

L

NEDGE2=9
NINT2=6

1110

1120

EDGE SHRINKAGE COMPENSATED DEVICES

BACKGROUND OF THE INVENTION

1. Field of the Invention

The present invention relates to the field of solid state devices, and more particularly to the processing of capacitors, resistors and other circuit devices in integrated circuits.

2. Background of the Invention

Capacitors are typically made of two parallel conductive plates that are separated by an insulator. The insulator may be air or some other suitable dielectric material. Capacitors such as MOS ("metal-oxide-semiconductor") capacitors are formed in solid state devices such as integrated circuits ("IC's") by depositing conductive regions (formed for example of aluminum or some other conductive material) on the surface of an insulating layer (for example silicon dioxide) formed over a conductive substrate (such as doped silicon). The aluminum and conductive substrate act as the charge storing plates of a capacitor, separated by the dielectric insulating layer. Capacitors can also be formed using doped polysilicon as plates as well as silicon nitride or sandwiches of silicon nitride and silicon dioxide as the insulating layer.

The capacitance of a capacitor is related to the surface area of its conductive regions or plates. Because of variability inherent in the IC fabrication process, it is difficult to precisely control the area of a conductive region being formed. FIG. 1 illustrates a capacitor cell 100 of side lengths X and Y and a dimensional variations dX and dY that can occur during processing. These variations are typically on the order of between zero plus or minus 1 micron. Because of these variations, it is difficult to manufacture IC's with capacitors having completely accurate capacitance values and ratios.

The performance of certain circuits, for example switched capacitor filter circuits, do not depend as much on the absolute values of the capacitors in the circuit as on the ratios between capacitors. Because the dimensional variations created by the manufacturing process generally affect all areas of an IC being manufactured, capacitor ratios do not vary as much as the actual capacitor dimensions and absolute capacitances. That is especially true if the conductive surfaces of each of the ratioed capacitors have the same perimeter to area ratio.

To design capacitors related to one another according to desired capacitor ratios, the concept of a unit cell is commonly used. A unit cell is a conductive layer having a standard, predetermined size and shape, typically a square. All capacitors on an IC that are to be related to each other by predetermined capacitor ratios are made of groups or arrays of electrically interconnected whole or partial unit cells. Since the cells are all nominally the same size and shape, the capacitors each ideally have the same approximate perimeter to area ratio. FIGS. 2A-C show three capacitors. Capacitor 200 is made up of a single unit cell. Capacitor 210 is made up of two unit cells, and capacitor 220 is made up of four unit cells. The capacitance ratio (also referred to as the "capacitor ratio") for any two capacitors is equal to the ratio of the number of unit cells of each. For example, the capacitance ratio of capacitor 220 to capacitor 200 is 4:1 or 4(4 unit cells versus 1 unit cell). The capacitance ratio of capacitor 220 to capacitor 210 is 2:1 or 2(4 unit cells versus 2 unit cells).

In addition to the generalized dimensional variability that occurs in the manufacturing of IC's discussed above that affects all areas of an IC substantially equally (and which, as discussed above, allows capacitor ratios to be more precise than the underlying capacitors), there are additional local effects that cause variability in capacitor ratios. One of these effects is perimeter edge shrinkage, which affects the unbounded (or "exposed") outside perimeter edges of the unit cells making up a capacitor. With respect to capacitor 220 in FIG. 2C this shrinkage occurs along exposed perimeter edges 222a to 222h, but not along inside perimeter edges 224a to 224h. For a unit cell having a side dimension of about 30 microns, the amount of exposed perimeter edge shrinkage is typically between 0 and 0.1 microns. The unit cell of capacitor 200 has only exposed perimeter edges. Accordingly, edge shrinkage is experienced by all four edges.

FIGS. 3A-B compare the edge shrinkage that occurs in the single unit cell of capacitor 200 to the edge shrinkage that occurs in one of the unit cells of capacitor 220, namely top right hand unit cell 220a. In FIGS. 3A-B, "L" represents the nominal dimension of a unit cell, and "dL" represents the shrinkage that occurs at an exposed edge. The single unit cell of capacitor 200 experiences shrinkage along all four edges. The area of the unit cell after shrinkage is $(L-2dL)^2$. Unit cell 220a of capacitor 220 only experiences shrinkage along two of its edges. The area of unit cell 220a after shrinkage is therefore $(L-dL)^2$. Because of the edge shrinkage effects, the ratio between the unit cell of capacitor 200 and unit cell 220a of capacitor 220 is not equal to unity, but is instead equal to $(L-2dL)^2/(L-dL)^2$. The actual ratio depends on the magnitude of the nominal cell size L and the amount of shrinkage dL.

The approach used in the prior art to counteract the effects of unit cell edge shrinkage is illustrated in FIGS. 4A-B. "Guard rings" 420 and 440 consisting of passive "dummy" unit cells 400 are created around each capacitor, in this case capacitors 410 (one unit cell) and 430 (four unit cells). A dummy unit cell is a unit cell that is substantially the same as the unit cells of a capacitor except that it is not electrically connected to the other unit cells of the capacitor. The guard rings form a protective barrier or shield around the unit cells of the capacitor, effectively preventing edge shrinkage from the exposed edges of the capacitor.

Although the guard rings used in the prior art minimize the effects on capacitor ratios caused by cell edge shrinkage, guard rings occupy a large amount of scarce IC surface area. For example, guard ring 420 in FIG. 4A is made up of eight dummy unit cells, while capacitor 410 itself is made of only one. Guard ring 420 therefore occupies eight times as much surface area as capacitor 410. In a similar manner, guard ring 440 (made up of 12 dummy unit cells) occupies three times as much surface area as capacitor 430 (made up of four unit cells).

SUMMARY OF THE INVENTION

Instead of attempting to eliminate edge shrinkage completely by using the guard rings of the prior art (and incurring the resultant high cost in terms of surface area used), the present invention instead arranges the individual cells of capacitors and uses passive dummy cells so as to achieve a ratio between the length of the exposed perimeters of the cells of the two capacitors that is equal to the desired capacitance ratio between the two capacitors. By doing so, the edge shrinkage effects on both cells are taken into account, and accurate capacitor ratios are maintained without wasting valuable surface area. In one embodiment of the invention the number of intersections between exposed edges of the cells of the two capacitors are also adjusted to conform to the capacitor ratio to achieve additional edge shrinkage compensation.

BRIEF DESCRIPTION OF THE DRAWINGS

FIG. 1 illustrates a unit cell of a capacitor of the prior art.

FIGS. 2A-C illustrate three different capacitors of the prior art formed from unit cells.

FIGS. 8A-B illustrate how the edge shrinkage shown in FIGS. 5A-B is compensated for by a second embodiment of the present invention.

FIGS. 9A-B illustrate how the edge shrinkage shown in FIGS. 5A-B is compensated for by a third embodiment of the present invention.

DETAILED DESCRIPTION OF THE INVENTION

Edge shrinkage compensated capacitors and a method for making the same are presented. In the following description, numerous specific details, such as unit cell size, shape and placement, are set forth in detail in order to provide a thorough description of the present invention. It will be apparent, however, to one skilled in the art that the present invention may be practiced without these specific details. In other instances, well known features have not been described in detail so as not to obscure the present invention.

Figure 3A:
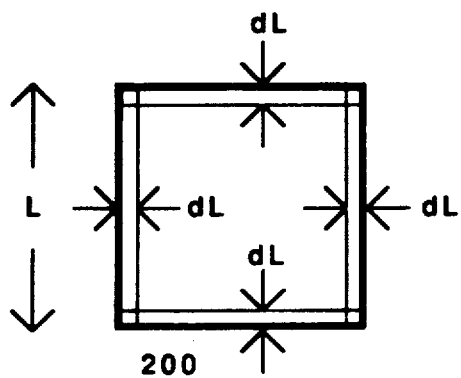
FIGS. 3A-B are detailed illustrations of two of the unit cells forming the capacitors of FIGS. 2A-C.
Figure 3B:
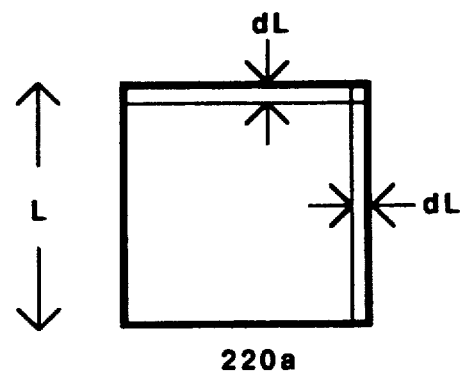
Figure 4A:
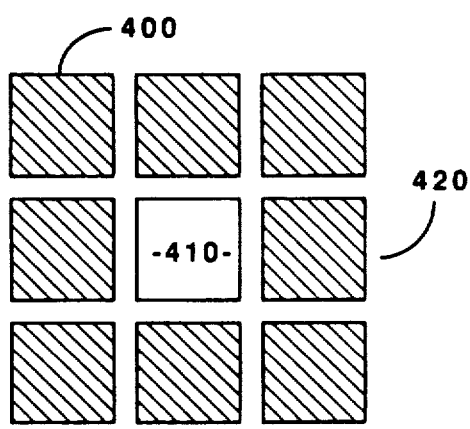
FIGS. 4A-B illustrate the guard rings of the prior art.
Figure 4B:
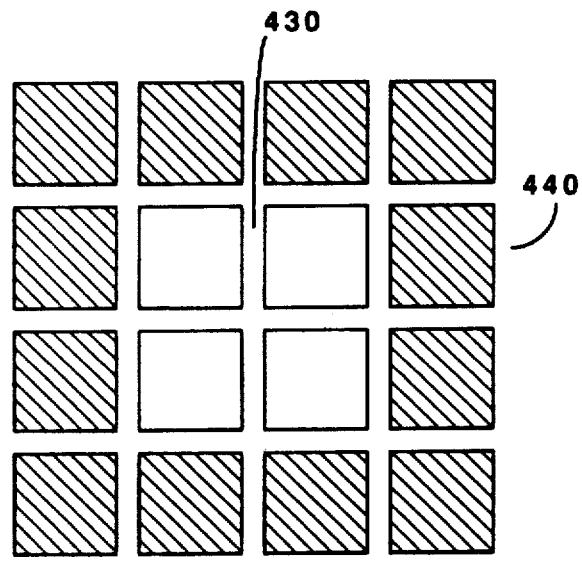
Figure 5A:
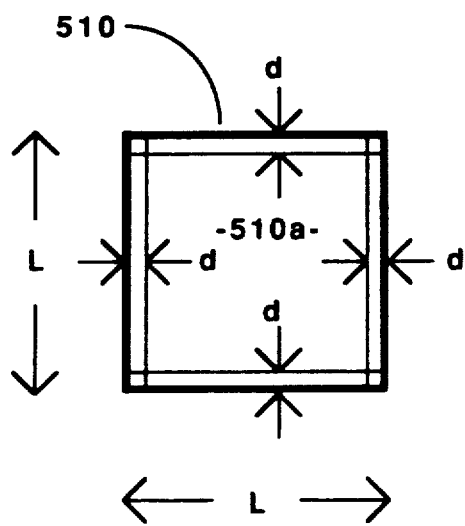
FIG. 5 is an illustration showing edge shrinkage that occurs in two capacitors.
Figure 5B:
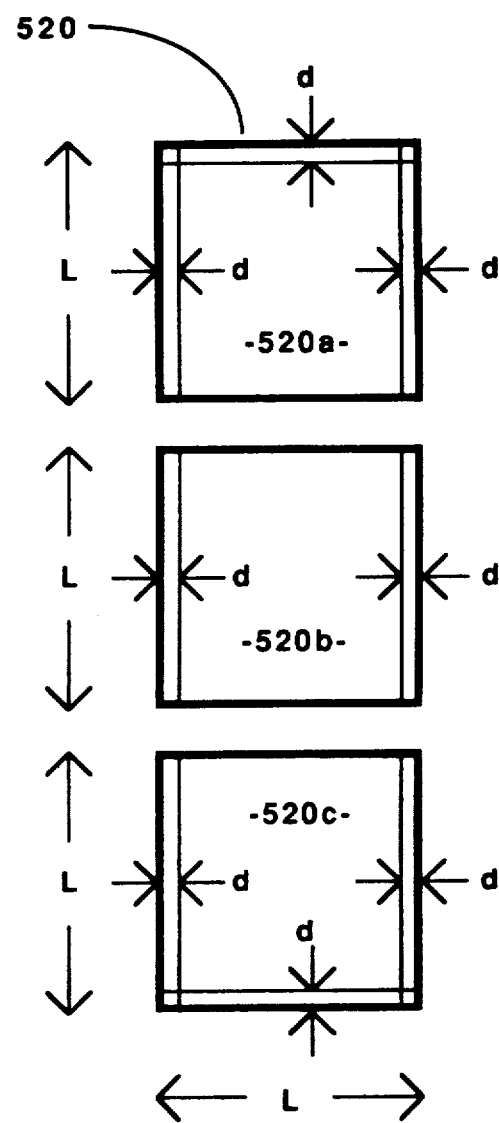

FIGS. 5A-B show two capacitors 510 and 520. Capacitor 510 consists of a single unit cell 510a. Capacitor 520 consists of three unit cells 520a and 520c. The intended capacitor ratio of capacitor 520 to capacitor 510 is 3:1. Each unit cell is square with sides of length L. Each external perimeter edge experiences edge shrinkage of magnitude dL. Unit cell 510a experiences edge shrinkage on all four sides. Unit cells 520a and 520c experience cell shrinkage on three sides, while unit cell 520b experiences cell shrinkage on two opposite sides. The resulting area of cell 510a is $(L-2dL)^2$. The resulting areas of cells 520a, 520b and 520c are $(L-2dL)(L-dL)$, $L(L-2dL)$ and $(L-2dL)(L-dL)$, respectively. The corresponding ratio between the area of capacitor 520 and the area of capacitor 510 is:

$$\frac{(L-2dL)(L-dL) + L(L-2dL) + (L-2dL)(L-dL)}{(L-2dL)^2} \quad (1)$$

$$\frac{3L^2 - 8LdL + 4dL^2}{L^2 - 4LdL + 4dL^2} \quad (1a)$$

Figure 6A:
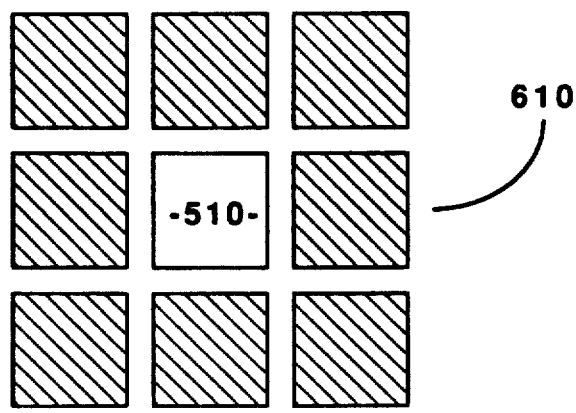
FIG. 6A-B illustrates how the edge shrinkage shown in FIGS. 5A-B is prevented by means of guard rings of the prior art.
Figure 6B:
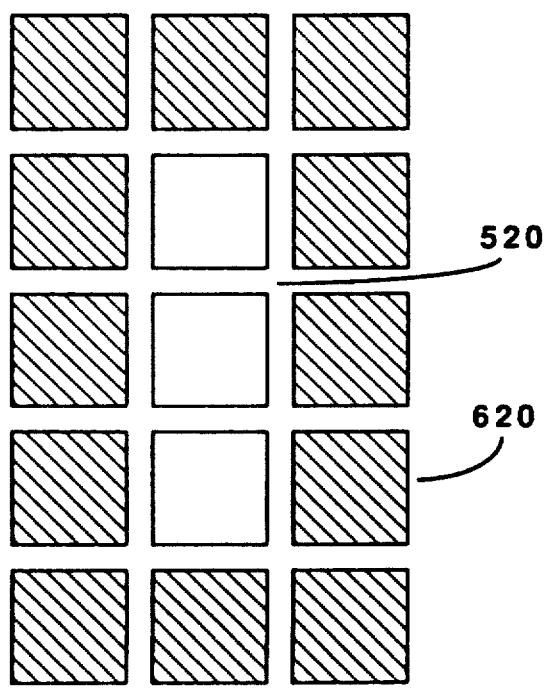

Ratio (1a) does not equal the desired value of 3 except for $dL=0$ (i.e., unless there is no edge shrinkage). In the prior art, as described above, edge shrinkage is prevented by surrounding each of capacitors 510 and 520 by a "guard ring" of dummy cells. Such guard rings are shown in FIGS. 6A-B. As shown in FIGS. 6A-B, 20 dummy cells are needed to produce the guard rings of the prior art.

The present invention, rather than attempting to eliminate all edge shrinkage, instead arranges unit cells and dummy cells such that there is a proportional amount of area shrinkage for each of the two capacitors. Instead of dedicating IC surface area to eliminate edge shrinkage entirely, the present invention uses placement of dummy and unit cells to achieve relative amounts of shrinkage between the two capacitors that corresponds to the desired capacitor ratio.

Figure 7A:
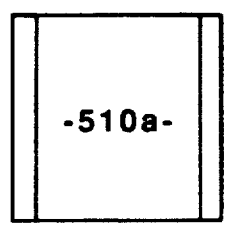
FIGS. 7A-B illustrate how the edge shrinkage shown in FIGS. 5A-B is compensated for by one embodiment of the present invention.
Figure 7A:
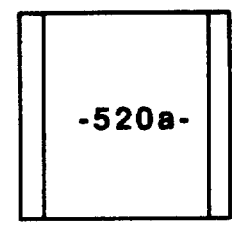
Figure 7A:
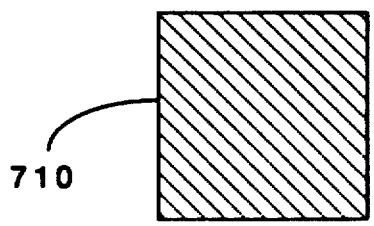
Figure 7A:
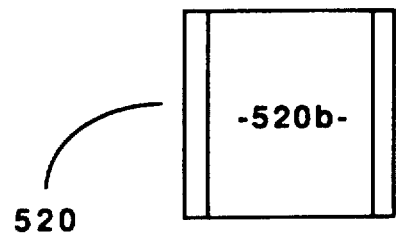
Figure 7A:
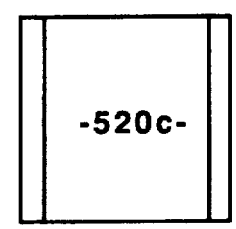
Figure 7B:
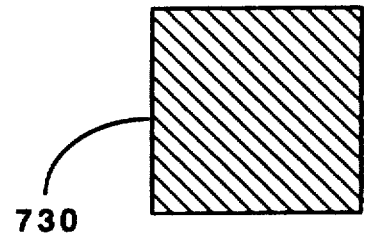
Figure 10A:
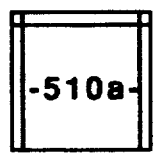
FIGS. 10A-B illustrate how the edge shrinkage shown in FIGS. 5A-B is compensated for by a fourth embodiment of the present invention.
Figure 10A:
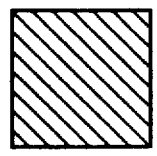
Figure 10B:
Figure 10B:
Figure 10B:
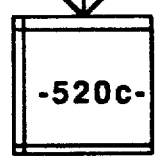
Figure 10B:
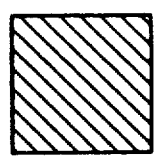

FIGS. 7A-B show one example of capacitors constructed according to the present invention. In this example, instead of surrounding each capacitor array with dummy cells according to the prior art (and thereby using up valuable surface area) the present invention selectively places a limited number of dummy cells adjacent to the capacitor arrays so as to match the relative shrinkage of one array to that of the other according to the desired capacitor ratio. In FIGS. 7A-B, dummy cells 700 and 710 are placed at opposite sides of unit cell 510a of capacitor 510. The number of edges of unit cell 510a that experience shrinkage is thereby reduced from four to two. Another two dummy cells 720 and 730 are placed on either side of the linear array of unit cells 520a to 520c that make up capacitor 520. Dummy cell 720 reduces the number of edges of unit cell 520a that experience shrinkage from three to two, and dummy cell 730 reduces the number of edges of unit cell 520c that experience shrinkage from three to two as well. As a result, each of unit cells 510a, 520a, 520b and 520c experiences shrinkage on two opposite sides. The amount of shrinkage of each of the three unit cells of capacitor 520 is the same as the shrinkage of the single unit cell of capacitor 510, and the desired capacitor ratio of 3:1 is attained.

One way to determine the placement of the dummy cells in FIGS. 7A-B is to examine the number of exposed edges in each of the two capacitor arrays 510 and 520 of FIGS. 5A-B. The number of exposed edges is approximately proportional to the area shrinkage that occurs. Shrinkage occurs in a direction orthogonal to the exposed edge. The amount of shrinkage is therefore approximately equal to the length of the exposed edge multiplied by dL. For unit cells, each edge has the same length L. The amount of shrinkage, in terms of area, that occurs along an exposed edge is therefore equal to L*dL. The total area shrinkage that occurs along all exposed edges is, roughly, the number of edges ("NEDGE") multiplied by the amount of shrinkage per edge (L*dL). This total is reduced by (dL)² for each intersection between exposed edges. The expression for the amount of edge shrinkage that occurs in a capacitor array made up of an arbitrary number of unit cells of side length L therefore is:

$$ASHRNK = (NEDGE)(L*dL) - (NINT)(dL)^2 \quad (2)$$

where:
ASHRNK = total area of edge shrinkage
L = nominal edge length
dL = amount of shrinkage orthogonal to edge
NEDGE = total number of exposed edges
NINT = the number of exposed edge intersections For values of dL that are small compared to L, the term (dL)² can, for a first order approximation, be disregarded. Accordingly, the shrinkage along each type of exterior edge can be approximated to be equal to L*dL, and the total shrinkage for a capacitor array is simply the total number of exterior edges of the cells in the array multiplied by L*dL.

In order to insure that the desired capacitor ratio CR is maintained after edge shrinkage occurs, the ratio of the amount of shrinkage for each capacitor must also equal the desired capacitor ratio. Since the amount of shrinkage is proportional to the number of exposed edges in a capacitor array, the relative amount of shrinkage equals the desired ratio if the relative number of exposed edges equals the desired ratio. The number of exposed edges can be increased or reduced by modifying the layout of the array and adding appropriate dummy cells.

The desired capacitor ratio for the two capacitor arrays in FIGS. 5A-B is 2:1. To achieve this desired capacitor ratio, the ratio of the number of exposed edges of capacitor array 510 ("NEDGE1") to the number of exposed edges of capacitor array 520 ("NEDGE2") must also be equal to the desired capacitor ratio of 3:1. Referring to FIGS. 5A-B, capacitor array 510 consists of a single unit cell 510a having four exposed sides. NEDGE1 is therefore equal to 4. Capacitor array 520, on the other hand, has one unit cell with two exposed sides (cell 520b) and two unit cells with three exposed sides each (cells 520a and 520c). NEDGE2 is therefore equal to 8. The ratio of exposed edges is therefore 8:4, or 2:1. The desired ratio, however, is 3:1.

One way to achieve the desired ratio would be to increase NEDGE2, if possible, such that it is equal to three times NEDGE1. Since NEDGE1 is 4, NEDGE2 would have to be increased to 12. Since there are only 3 unit cells in capacitor array 520, in order for NEDGE2 to be equal to 12, each of the 3 unit cells 520a to 520c would need to have four exposed sides, that is, all four sides of each of the 3 unit cells would have to be exposed to shrinkage. This circumstance can be achieved by separating each of the three unit cells a sufficient amount in order for the shielding effects of an adjacent cell edge to be eliminated. It has been found that spacing unit cells at least the length of one side of the unit cell ("L") apart from one another achieves this result. FIGS. 8A-B show how units cells 520a, 520b and 520c may be arranged a distance L apart to exhibit a total of 12 sides of shrinkage.

Widely separating unit cells to increase the number of edges exposed to shrinkage is practical generally only when a small number of unit cells are involved. When larger numbers of cells are used in an array, it is more practical to use dummy unit cells to reduce the number of exposed edges than to widely separate the cells to increase the number of exposed edges. To achieve the desired ratio between two capacitors, the number of exposed sides of one or both are reduced to achieve the desired ratio. In the example described above, NEDGE1 = 4, NEDGE2 = 8, and the desired ratio NEDGE2:NEDGE1 is 3:1. To achieve the desired ratio without increasing NEDGE2 (assuming that it is not practical to widely separate unit cells), then NEDGE1 must be reduced to at least ⅓ the value of NEDGE2. One-third of NEDGE2 is approximately 2.67. By placing two dummy cells 700 and 710 adjacent to two sides of unit cell 510 as in FIGS. 7A-B, NEDGE1 is reduced to 2, which is below the maximum allowable value of 2.67. To achieve a 3:1 ratio, NEDGE2 must be three times NEDGE1, or 6. NEDGE2 must therefore be reduced from 8 to 6. This reduction may be accomplished by placing the two dummy cells 720 and 730 as shown in FIGS. 7A-B. The overall result is that NEDGE1 = 2, NEDGE2 = 6, and NEDGE2:NEDGE1 equals the desired ratio of 3:1.

To account for the effects of intersecting exposed edges, the ratios of the numbers of intersections between exposed edges (also referred to herein as "exposed intersections") for the two capacitors must also equal the desired capacitor ratio. The number of exposed intersections in capacitor 520 in FIGS. 7A-B should therefore preferably be equal to three times the number of exposed intersections in capacitor 510. In the arrangement shown in FIGS. 7A-B, the number of intersections in each capacitor array is zero, and this relationship is fulfilled.

Other arrangements of dummy cells and unit cells 510a, 520a, 520b, and 520c according to the present invention are shown in FIGS. 9A-B and 10A-B. In each case, the ratios of NEDGE2 to NEDGE1 and NINT2 to NINT1 are equal to the desired CR of 3.

The description above has dealt mainly with the situation where standard-sized unit and dummy cells are used to form capacitors. The present invention is also applicable to more generalized, arbitrary capacitor and dummy cell sizes.

As discussed above, the criteria used in the present invention to achieve a desired capacitor ratio ("CR") for two capacitors "C1" and "C2" (CR = C2/C1) are:

(A) The ratio of the nominal (before manufacturing variations and edge shrinkage effects) areas A2 and A1 of C2 and C1, respectively, should be equal to CR.

(B) The perimeter to area ratio for C2 should be equal to the perimeter to area ratio for C1.

(C) Assuming unit cells are used, the ratio of the number of exposed exterior edges of the cell array for C2 to the number of exposed exterior edges of the cell array for C1 should be equal to CR.

(D) And, optionally, the ratio of the number of intersections between exposed exterior edges of the cell array for C2 to the number of exposed exterior edges of the cell array for C1 should also be equal to CR.

Criteria (A), (B) and (D) also apply in the more general case where arbitrarily sized cells instead of only standard unit cells are used. Criteria (C), however, takes a somewhat different formulation. Instead of requiring that the ratio of the number of exposed edges of one capacitor array to the number of exposed edges of another be equal to the desired capacitor ratio CR, the more general formulation of (C) is that the ratio of the length of the exposed perimeter edges of one capacitor array to the length of the exposed perimeter edges of the other capacitor array is equal to ratio CR.

It is not necessary to meet the above criteria exactly to achieve the benefits of the present invention, particularly with respect to exactly obtaining the ratios specified. Ratios that are only approximately equal to the specified ratios will also result in improved capacitor ratio accuracies as compared to the prior art.

Figure 11A:
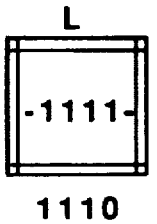
FIGS. 11A-B illustrate two capacitors, one of which includes an oversize, non-unit cell.
Figure 11B:
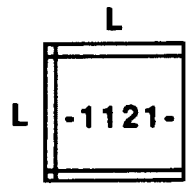
Figure 11B:

An application of the general case of the present invention is illustrated in FIGS. 11A-B. FIGS. 11A-B illustrate capacitors 1110 and 1120 related in a ratio of 2.5:1. Capacitor 1110 consists of a single unit cell 1111 with sides of length L. It has a nominal (before edge shrinkage effects) area of $L^2$. The total area of capacitor 1120 is two and a half times the area of capacitor 1110. Capacitor 1120 consists of a unit cell 1121 identical in size to unit cell 1111 of capacitor 1110 and a non-unit cell 1122 of width A and height B. In general, any ratioed capacitor can be formed by an integer number of unit cells and a single oversize non-unit cell having an area of between one and two times the area of a unit cell, like capacitor 1120.

Criteria (A) above is met by capacitor 1120 if the area of non-unit cell 1122 is equal to $1.5L^2$. This value, plus the area of unit cell 1121 (which, like the area of unit cell 1111, is equal to $L^2$) results in the desired capacitor ratio of CR = 2.5. Since the area of cell 1122 is equal to $A*B$, the following expression results:

$$A*B = 2.5L^2 \qquad (3)$$

or, in the more general case for any capacitor made of an integer number of unit cells N and a single oversize non-unit cell and having a desired capacitor ratio of CR with respect to a unit cell capacitor of side L and area $L^2$:

$$A*B = (CR - N)(L^2) \qquad (3a)$$

In the example of FIGS. 11A-B, CR equals 2.5 and N equals 1, so equation (3a) reduces to equation (3). Equation (3a) also holds when no unit cells are used in capacitor 1120, but only a single non-standard cell is used. In that case, N would be equal to zero.

With respect to criteria (B), the perimeter to area ratio for capacitor 1110 is $(4L)/(L^2)$ or $(4/L)$. The perimeter to area ratio for capacitor 1120 will also be equal to $(4/L)$ if the perimeter to area ratio for each cell making up capacitor 1120 is equal to $(4/L)$. Because cell 1121 is a unit cell like cell 1111, it already has the desired perimeter to area ratio. For cell 1122, however, dimensions A and B must be adjusted to obtain the desired ratio. The perimeter of cell 1122 is $2A + 2B$. The area of cell 1122 is $A*B$. The desired perimeter to area ratio is $(4/L)$. Accordingly, a second expression for A and B in terms of L results:

$$(2A + 2B)/(A*B) = (4/L) \qquad (4)$$

Equations (3a) and (4) can be solved simultaneously to obtain a general expression for A and B. Resulting expressions for A and B are:

$$A = \qquad (5a)$$

$$\frac{2(CR - N)(L) - SQRT((2(CR - N)(L))^2 - 4((CR - N)(L^2)))}{2}$$

$$B = \qquad (5b)$$

$$\frac{2(CR - N)(L) + SQRT((2(CR - N)(L))^2 - 4((CR - N)(L^2)))}{2}$$

For capacitor 1120, (CR − N) equals 1.5, and expressions (5a) and (5b) become:

$$A = (3L - SQRT(3L^2))/2 = 0.63L \qquad (6a)$$

$$B = (3L + SQRT(3L^2))/2 = 2.37L \qquad (6b)$$

To satisfy criteria (C) above, the ratio of the total length of exposed perimeter of capacitor 1120 must equal 2.5 times the total length of exposed perimeter of capacitor 1110. For the configuration shown in FIG. 11A, the length of the exposed perimeter of capacitor 1110 is 4L. The desired length of the exposed perimeter is therefore 2.5 times 4L, or 10L. For the configuration of cells 1121 and 1122 of capacitor 1120 in FIG. 11B, the length of exposed perimeter of cell 1121 is 3L. The length of exposed perimeter of cell 1122 is 0.63L + 2.37L + 0.63L + 1.37L or 5L. The total exposed perimeter for capacitor 1120 is therefore 3L + 5L or 8L, which is less than the desired value of 10L. The lengths of the exposed perimeters must therefore be adjusted to achieve the desired 2.5:1 ratio.

Figure 12A:
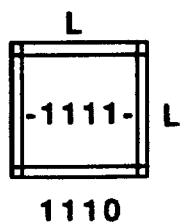
FIGS. 12A-B illustrate one embodiment of the present invention applied to the capacitors of FIGS. 11A-B.
Figure 12B:
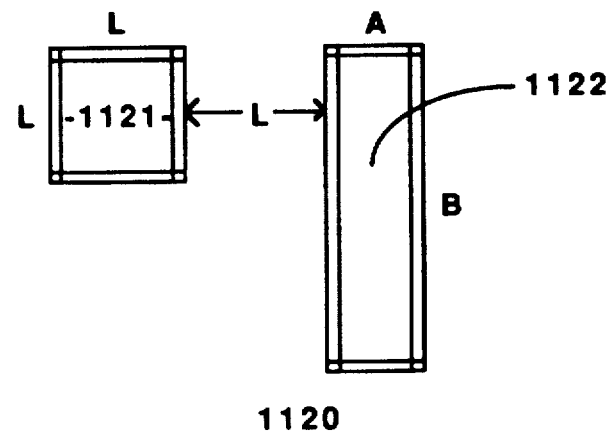

One way to do so is to separate cells 1121 and 1122 so that all edges are exposed. That can be accomplished by separating cells 1121 and 1122 by a distance L as shown in FIG. 12B. The total exposed perimeter of capacitor is then equal to 4L for cell 1121 plus (2.37L + 0.63L + 2.37L + 0.63L) or 6L for cell 1122. The total for both cells is 4L + 6L or 10L, which is desired amount.

Separating cells 1121 and 1122 as shown in FIG. 12B results in the desired exposed perimeter length ratio, and results in a consistently more accurate capacitor ratio than obtainable in the prior art. However to obtain even greater accuracy, criteria (D) can also be fulfilled: that is, the ratio of the number of intersections between exposed exterior edges of capacitors 1110 and 1120 is made to correspond to the desired capacitor ratio, in this example 2.5. Cell 1111 of capacitor 1110 in FIG. 12A has four intersections between exposed edges. Cells 1121 and 1122 each also have four, for a total of 8. Given capacitor 1110's four intersections and the desired capacitor ratio of 2.5, the desired number of intersections between exposed edges in capacitor 1120 is 10. Since cells 1121 and 1122 only have a total of eight corners, and each already contains an intersection between exposed edges, the number of intersections in cells 1121 and 1122 cannot be increased. However, the number of intersections in cell 1111 can be reduced.

Reducing the number of intersections in cell 1111 by one, to a new value of 3, would require 3 times 2.5 or 7.5 intersections in capacitor 1120. The actual number of intersections between exposed edges of capacitor 1120 in FIG. 12B is 8, which is approximately equal to the desired value of 7.5.

Figure 13A:
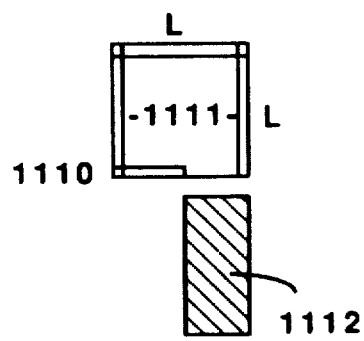
FIGS. 13A-B illustrate a second embodiment of the present invention applied to the capacitors of FIGS. 11A-B.
Figure 13B:
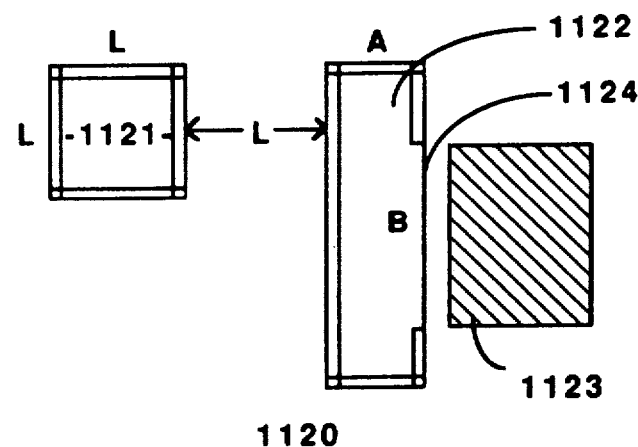

One way to reduce the number of intersections of exposed edges (which may also be referred to as "exposed intersections") of cell 1111 from 4 to three is by placing a dummy cell of length L/2 and width L adjacent to cell 1111 as shown in FIG. 13A. Doing so reduces the number of exposed intersections by one, to three. In addition, however, the length of the exposed perimeter of cell 1111 is reduced by L/2. This reduction is exposed perimeter of cell 1111 by L/2 requires a corresponding 1.25L (2.5 times 0.5) reduction in the exposed perimeter of capacitor 1120. That reduction can be accomplished by placing a dummy cell 1123 of length 1.25L and width L adjacent to cell 1122 as shown in FIG. 13B. By placing the dummy cell adjacent the middle of right exposed edge 1124 as shown, the length of the exposed perimeter is reduced while the number of exposed intersections is maintained.

Figure 14A:
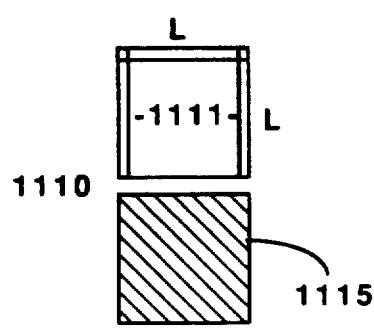
FIGS. 14A-B illustrate a third embodiment of the present invention applied to the capacitors of FIGS. 11A-B.
Figure 14B:
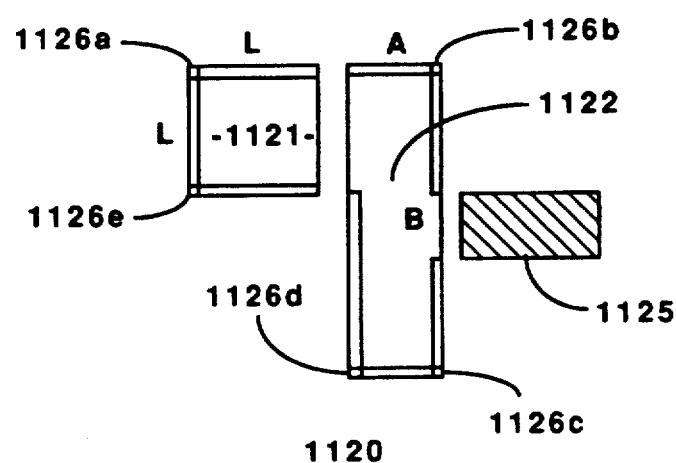

Another arrangement of capacitors 1110 and 1120 according to the present invention is shown in FIGS. 14A-B. In the arrangement of FIGS. 14A-B, a unit dummy cell 1115 is placed adjacent to unit cell 1111, reducing the exposed intersections of cell 1111 from four to two and reducing the length of its exposed perimeter from 4L to 3L. Cells 1121 and 1122 of capacitor 1120 are placed adjacent to each other as in FIGS. 11A-B. In this arrangement, capacitor 1120 has five exposed intersections 1126a to 1126c and, as explained above with respect to FIGS. 11A-B, an exposed perimeter of length 8L. The desired number of exposed intersections of capacitor 1120 according to criteria (D) is 2.5 times two, or five, which, in this example, corresponds to the actual number of exposed intersections. Criteria (D) is therefore fulfilled and the number of exposed intersections in capacitor 1120 need not be adjusted. The desired length of exposed perimeter of capacitor 1120 according to criteria (C) is 2.5 times 3L or 7.5L, which is 0.5L less than the actual exposed perimeter of capacitor 1120. Placing a dummy cell 1125 of length ½L adjacent to cell 1122 as shown in FIG. 14B reduces the exposed perimeter of capacitor 1120 by 0.5L to the desired 7.5L length.

Figure 15A:
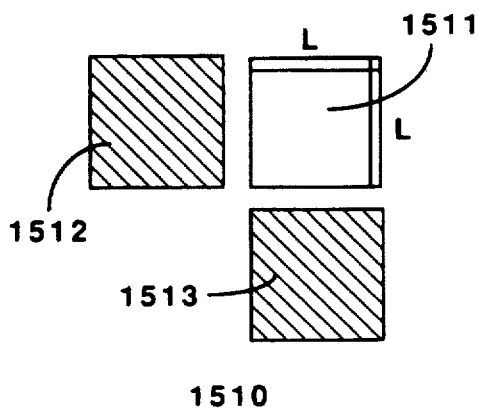
FIGS. 15A-B illustrate a further embodiment of the present invention.
Figure 15B:
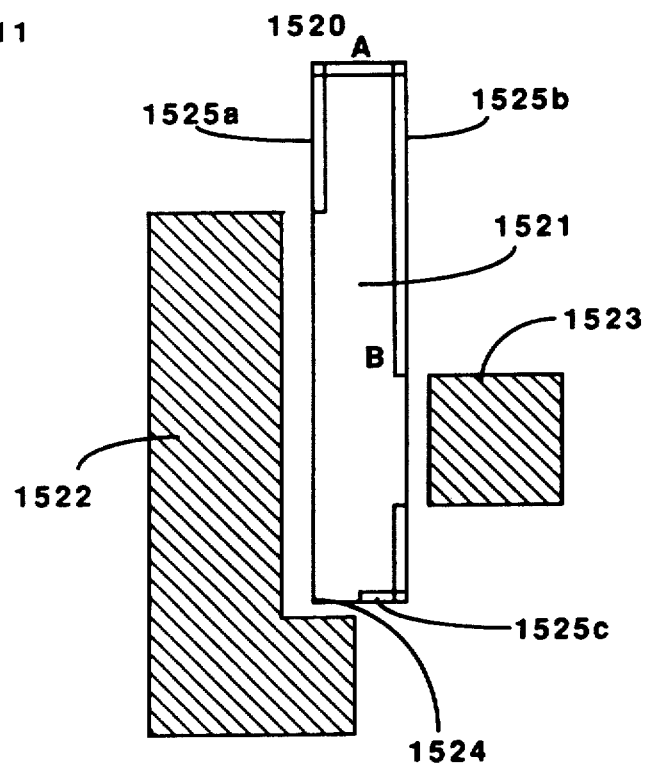

FIGS. 15A-B show how the present invention may be applied to two capacitors 1510 and 1520 which each consist of only a single cell. The desired capacitor ratio CR of capacitor 1520 to 1510 for purposes of this example will be assumed to be 3.0:1. Cell 1511 is a square cell of side L. According to equations (5a) and (5b) above, the values for the width A and length B of cell 1521 of capacitor 1520 are approximately 0.55L and 5.45L, respectively. Cell 1511 has an exposed perimeter length of 4L and four exposed intersections. Cell 1521 also has four exposed intersections and an exposed perimeter length of 12L.

Cell 1521 can have no more than four exposed intersections in its current rectangular form. To fulfill criteria (D) above and obtain the desired ratio between the exposed intersections of capacitor 1520 and those of capacitor 1510, the number of exposed intersections of capacitor 1510 in the example shown in FIGS. 15A-B is reduced from four to one by placing two dummy unit cells 1512 and 1513 adjacent to cell 1511. Along with the resulting reduction in the number of exposed intersections, the length of exposed perimeter is reduced from 4L to 2L. Using the desired capacitor ratio of 3.0:1, the desired number of exposed intersections of capacitor 1520 is 3.0 times 1 or three and the desired exposed perimeter length is 3.0 times 2L or 6L. Without any shielding dummy cells, cell 1521 of capacitor 1520 has four exposed intersections and an exposed perimeter length of 12L. To achieve the desired number of exposed intersections and exposed perimeter length, one exposed intersection and 6L of exposed perimeter must be shielded by dummy cells. Such shielding can be accomplished by means of the two dummy cells 1522 and 1523 shown in FIG. 15B. Dummy cell 1522 is an L-shaped cell that extends 4.75L along side 1525a of cell 1521, around intersection 1524, and 0.25L along side 1525c. Cell 1523 is a unit dummy cell of side L placed along the middle portion of side 1525b. The total length of exposed perimeter of cell 1521 shielded by dummy cells 1522 and 1523 is 6L, leaving the remaining exposed perimeter at the desired value of 6L. Dummy cell 1522 also shields intersection 1524, resulting in the desired value of three exposed intersections for capacitor 1520.

Accordingly, a novel design for ratioed capacitors is presented. The present invention overcomes variations in capacitor ratios found in the prior art by compensating for edge shrinkage effects. The above examples illustrate certain specific embodiments of the present invention. However, the present invention is not limited to these particular embodiments. For example, although the examples described above involve rectangular capacitor cells, the invention includes other shapes (for example circles, triangles, polygons and other, arbitrary shapes) as well. Although the capacitors described above have specific numbers, sizes and arrangements of capacitor and dummy cells, the present invention can be used with capacitors having any desired number, size, shape and arrangement of cells. The invention is applicable to other solid state devices, in addition to capacitors, for which accurate area ratios are desired, such as ratioed resistors (implanted, thin film, poly-silicon, diffused, etc.). In addition, the present invention has application to capacitors used on substrates forming hybrid integrated devices, such as PC circuit boards, ceramic substrates, etc., where capacitors are patterned on inert mounting materials.

I claim:

1. A method for compensating for edge shrinkage effects along perimeters of first and second conductive regions formed on a surface, the ratio of the area of said second conductive region to the area of said first conductive region having a nominal value of R, said method comprising the steps of:
   determining the length of the perimeter of said first conductive region along which edge shrinkage occurs;
   determining the length of the perimeter of said second conductive region along which edge shrinkage occurs; and
   adjusting said lengths of said perimeters of said first and second conductive regions along which edge shrinkage occurs such that a ratio of the adjusted length of said perimeter of said second conductive region along which edge shrinkage occurs to the adjusted length of perimeter of said first conductive region along which edge shrinkage occurs is approximately equal to said ratio R.

2. The method of claim 1 wherein said first conductive region comprises a plurality of electrically connected conductive regions.

3. The method of claim 1 wherein said second conductive region comprises a plurality of electrically connected conductive regions.

4. The method of claim 1 wherein said first conductive region comprises at least one conductive region comprising a unit cell.

5. The method of claim 1 wherein said second conductive region comprises at least one conductive region comprising a unit cell.

6. The method of claim 1 further comprising the steps of:
- determining the number of corners comprising intersections of portions of the perimeter of said first conductive region along which edge shrinkage occurs;
- determining the number of corners comprising intersections of portions of the perimeter of said second conductive region along which edge shrinkage occurs;
- adjusting said number of said corners of said first and second conductive regions such that a ratio of the adjusted number of said corners of said second conductive region to the adjusted number of said corners of said first conductive region is approximately equal to said ratio R.

7. The method of claim 6 wherein the number of said corners of at least one of said first and second conductive regions is adjusted by disposing at least one of said corners of at least one of said first and second conductive regions such that said corner is disposed a distance from other conductive regions such that edge shrinkage at said corner is not inhibited by any such other conductive regions.

8. The method of claim 6 wherein the number of said corners of at least one of said first and second conductive regions is adjusted by disposing a passive region not electrically connected to any of said first and second conductive regions adjacent to at least one of said corners such that said corner is shielded by said passive region such that edge shrinkage at said corner is inhibited by said passive region.

9. The method of claim 1 wherein said length of the perimeter of at least one of said first and second conductive regions along which edge shrinkage occurs is increased by disposing at least a portion of the perimeter of said conductive region such that said portion of said perimeter is disposed a distance from other regions such that edge shrinkage along said portion of said perimeter is not inhibited by any such other regions.

10. The method of claim 1 wherein said length of the perimeter of at least one of said first and second conductive regions along which edge shrinkage occurs is reduced by disposing a passive region not electrically connected to any of said first and second conductive regions adjacent to a portion of said perimeter such that said portion of said perimeter is shielded by said passive region such that edge shrinkage along said portion of said perimeter is inhibited by said passive region.

11. The method of claim 1 wherein at least one of said first and second conductive regions is formed from a conductive material.

12. The method of claim 11 wherein said conductive material comprises a metal.

13. The method of claim 12 wherein said metal comprises aluminum.

14. The method of claim 11 wherein said conductive material comprises polysilicon.

15. The method of claim 1 wherein said first and second conductive regions comprise capacitors.

16. The method of claim 1 wherein said first and second conductive regions comprise resistors.

17. First and second capacitors having first and second capacitances, the ratio of said second capacitance to said first capacitance having a nominal value of R, comprising:
- a first conductive region for said first capacitor formed on a surface; said first conductive region having a first area and comprising a first perimeter; first portions of said first perimeter comprising a first total length disposed adjacent to a portions of said first conductive region such that edge shrinkage along said first portions of said first perimeter is inhibited; second portions of said first perimeter comprising a second total length disposed adjacent to portions of at least one passive region not electrically connected to said first conductive region such that edge shrinkage along said second portions of said second perimeter is inhibited; and third portions of said first perimeter comprising a third total length disposed at a distance from any other regions such that edge shrinkage along said third portions of said perimeter is not inhibited by any such other regions; each of said first, second and third lengths being at least equal to zero;
- a second conductive region for said second capacitor formed on a surface; said second conductive region having a second area and comprising a second perimeter; first portions of said second perimeter comprising a first total length disposed adjacent to a portions of said second conductive region such that edge shrinkage along said first portions of said second perimeter is inhibited; second portions of said second perimeter comprising a second total length disposed adjacent to portions of at least one passive region not electrically connected to said second conductive region such that edge shrinkage along said second portions of said second perimeter is inhibited; and third portions of said second perimeter comprising a third total length disposed at a distance from any other regions such that edge shrinkage along said third portions of said perimeter is not inhibited by any such other regions; each of said first, second and third lengths being at least equal to zero;
- a ratio of said third total length of said second perimeter to said third total length of said first perimeter being approximately equal to said ratio R.

18. The capacitors of claim 17 wherein said first conductive region comprises a plurality of electrically connected conductive regions.

19. The capacitors of claim 17 wherein said second conductive region comprises a plurality of electrically connected conductive regions.

20. The capacitors of claim 17 wherein said first conductive region comprises at least one conductive region comprising a unit cell.

21. The capacitors of claim 17 wherein said second conductive region comprises at least one conductive region comprising a unit cell.

22. The capacitors of claim 17 further comprising:
- a first number of corners comprising intersections between said third portions of said first perimeter; and
- a second number of corners comprising intersections between said third portions of said second perimeter, a ratio of said second number to said first number being approximately equal to said ratio R.

23. The capacitors of claim 17 wherein said passive region comprises at least one passive unit cell.

24. The capacitors of claim 17 wherein said conductive regions comprise aluminum or polysilicon.

25. The capacitors of claim 17 wherein said conductive regions comprise any low resistivity metal or material suitable for forming a capacitor plate.

26. The capacitors of claim 17 wherein said surface comprises silicon dioxide.

27. The capacitors of claim 17 wherein said surface comprises silicon nitride.

28. The capacitors of claim 17 wherein said surface comprises layers of silicon dioxide and silicon nitride.

29. The capacitors of claim 17 wherein said surface comprises layers of an insulating material suitable for forming a capacitor dielectric.

30. The capacitors of claim 17 wherein said surface comprises a PC circuit board.

31. The capacitors of claim 17 wherein said surface comprises a ceramic substrate.

32. First and second resistors having first and second resistances, the ratio of said second resistance to said first resistance having a nominal value of R, comprising:

a first conductive region for said first resistor formed on a surface; said first conductive region having a first area and comprising a first perimeter; first portions of said first perimeter comprising a first total length disposed adjacent to a portions of said first conductive region such that edge shrinkage along said first portions of said first perimeter is inhibited; second portions of said first perimeter comprising a second total length disposed adjacent to portions of at least one passive region not electrically connected to said first conductive region such that edge shrinkage along said second portions of said second perimeter is inhibited; and third portions of said first perimeter comprising a third total length disposed at a distance from any other regions such that edge shrinkage along said third portions of said perimeter is not inhibited by any such other regions; each of said first, second and third lengths being at least equal to zero;

a second conductive region for said second capacitor resistor on a surface; said second conductive region having a second area and comprising a second perimeter; first portions of said second perimeter comprising a first total length disposed adjacent to a portions of said second conductive region such that edge shrinkage along said first portions of said second perimeter is inhibited; second portions of said second perimeter comprising a second total length disposed adjacent to portions of at least one passive region not electrically connected to said second conductive region such that edge shrinkage along said second portions of said second perimeter is inhibited; and third portions of said second perimeter comprising a third total length disposed at a distance from any other regions such that edge shrinkage along said third portions of said perimeter is not inhibited by any such other regions; each of said first, second and third lengths being at least equal to zero;

a ratio of said third total length of said second perimeter to said third total length of said first perimeter being approximately equal to said ratio R.

33. The resistors of claim 32 wherein at least one of said first and second conductive regions is formed from a semiconductor.

34. The resistors of claim 33 wherein said semiconductor comprises a thin film semiconductor.

35. The resistors of claim 33 wherein said semiconductor comprises polysilicon material.

36. The resistors of claim 33 wherein said semiconductor comprises an ion-implanted semiconductor.

37. The resistors of claim 33 wherein said semiconductor comprises a diffusion-doped semiconductor.

* * * * *

UNITED STATES PATENT AND TRADEMARK OFFICE
CERTIFICATE OF CORRECTION

PATENT NO. : 5,189,595

DATED : February 23, 1993

INVENTOR(S) : Dunkley

It is certified that error appears in the above-identified patent and that said Letters Patent is hereby corrected as shown below:

In column 1, line 34, after the word "and", delete "a".

In column 3, line 8, delete "capacitors are", and insert in place thereof --capacitors is--;

line 20, delete "FIG. 5 is an illustration", and insert in place thereof --FIGS. 5A-B are illustrations--;

line 64, delete "520a and 520c", and insert in place thereof --520a to 520c--.

In column 5, line 68, delete "are involved", and insert in place thereof --is involved--.

In column 6, line 6, delete "are reduced" and insert in place thereof --is reduced--

In column 8, line 35, delete "of capacitor", and insert in place thereof --of the capacitor--;

line 38, delete "is desired", and insert in place thereof --is the desired--.

In column 9, line 5, delete "reduction is exposed", and insert in place thereof --reduction in exposed--;

line 31, delete "of exposed perimeter", and insert in place thereof --of the exposed perimeter--.

UNITED STATES PATENT AND TRADEMARK OFFICE
CERTIFICATE OF CORRECTION

PATENT NO. : 5,189,595
DATED : February 23, 1993
INVENTOR(S) : Dunkley

It is certified that error appears in the above-indentified patent and that said Letters Patent is hereby corrected as shown below:

In column 12, line 3, delete "to a portions", and insert thereof --to portions--; line 24, delete "to a portions", and insert thereof --to portions--.

Column 13, line 21, delete " to a portions", and insert thereof --to portions--.

Column 14, line 6, delete "to a portions", and insert thereof--to portions--.

Signed and Sealed this

Ninth Day of August, 1994

Attest:

BRUCE LEHMAN

*Attesting Officer*     *Commissioner of Patents and Trademarks*